United States Patent
Shabi et al.

(10) Patent No.: US 11,068,208 B2
(45) Date of Patent: Jul. 20, 2021

(54) CAPACITY REDUCTION IN A STORAGE SYSTEM

(71) Applicant: EMC IP Holding Company LLC, Hopkinton, MA (US)

(72) Inventors: Uri Shabi, Tel Mond (IL); Anton Kucherov, Dudley, MA (US)

(73) Assignee: EMC IP Holding Company LLC, Hopkinton, MA (US)

(*) Notice: Subject to any disclaimer, the term of this patent is extended or adjusted under 35 U.S.C. 154(b) by 106 days.

(21) Appl. No.: 16/666,729

(22) Filed: Oct. 29, 2019

(65) Prior Publication Data

US 2021/0124532 A1 Apr. 29, 2021

(51) Int. Cl.
*G06F 3/06* (2006.01)
*H03K 19/21* (2006.01)

(52) U.S. Cl.
CPC .......... *G06F 3/0661* (2013.01); *G06F 3/0608* (2013.01); *G06F 3/0673* (2013.01); *H03K 19/21* (2013.01); *G06F 3/067* (2013.01)

(58) Field of Classification Search
None
See application file for complete search history.

(56) References Cited

U.S. PATENT DOCUMENTS 10,444,992 B2 * 10/2019 Mizushima .......... G06F 3/0604
2011/0184921 A1  7/2011 Reiter et al.
2014/0244604 A1  8/2014 Oltean et al.
2015/0095158 A1 * 4/2015 Nasserbakht ......... H04W 12/06
                                                705/14.58
2017/0083581 A1 * 3/2017 Kozlovsky .......... G06F 16/1752

FOREIGN PATENT DOCUMENTS

CN          109948125 A         6/2019

OTHER PUBLICATIONS

Aronovich et al., "Similarity Based Deduplication with Small Data Chunks;" Journal Article from Discrete Applied Mathematics, vol. 212; Available Online Oct. 23, 2015; 13 Pages.
PCT International Search Report and Written Opinion dated Jan. 22, 2021 for International Application No. PCT/US2020/056781; 34 Pages.

* cited by examiner

*Primary Examiner* — Brian R Peugh
(74) *Attorney, Agent, or Firm* — Daly, Crowley Mofford & Durkee, LLP

(57) ABSTRACT

An aspect includes implementing capacity reduction in a storage system includes for each of a candidate page and a target page in the storage system, identifying a subset of sectors having identical data or a minimum amount of non-identical data, performing a bit-wise exclusive OR (XOR) operation on sectors of the candidate page and the target page, determining entropy from results of the XOR operation. Upon determining the entropy is less than or equal to a threshold value, an aspect includes building a reference page from an XOR sector containing results of the bit-wise XOR operation, and performing a compression operation on the reference page.

20 Claims, 6 Drawing Sheets

CAPACITY REDUCTION IN A STORAGE SYSTEM

BACKGROUND

Data optimization techniques reduce system administration and storage overhead costs. One optimization technique is compression in which a system re-encodes data in a form that uses fewer bits than the original data, which can increase storage efficiency, transmission speed, and processing efficiency. Another optimization technique is deduplication in which a system eliminates duplicate data across a file system to increase storage efficiency, transmission speed, and processing efficiency. Data sent to a storage system can be segmented in fixed- or varying-sized segments in which each segment may be identified by an identifier, such as a hash signature or hash of data. Once the identifier is generated it is used to determine if the data segment already exists in the system. If it does, it does not need to be stored again. While data compression techniques save on storage space, it can involve overhead costs such as increases in input/output (IO) access overhead.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to aspects of the disclosure, a method for capacity reduction in a storage system is provided. The method includes, for each of a candidate page and a target page in the storage system, identifying a subset of sectors having identical data or a minimum threshold amount of different data, performing a bit-wise exclusive OR (XOR) operation on sectors of the candidate page and the target page, storing results of the bit-wise XOR operation in a XOR sector; and determining entropy from results of the XOR operation. The entropy indicates corresponding data between the candidate page and target page are different. Upon determining the entropy is less than or equal to a threshold value, the method includes building a reference page from the XOR sector, and performing the compression operation on the reference page.

According to aspects of the disclosure, a system for capacity reduction in a storage system is provided. The system includes a memory comprising computer-executable instructions and a processor executing the computer-executable instructions, the computer-executable instructions when executed by the processor cause the processor to perform operations. The operations include for each of a candidate page and a target page in the storage system, identifying a subset of sectors having identical data or a minimum threshold amount of different data, performing a bit-wise exclusive OR (XOR) operation on sectors of the candidate page and the target page, storing results of the compressed bit-wise XOR operation in a XOR page, determining entropy from results of the XOR operation. The entropy indicates corresponding data between the candidate page and target page are different. Upon determining the entropy is less than or equal to a threshold value, the operations further include building a reference page from the XOR sector, and performing the compression operation on the reference page.

According to aspects of the disclosure, a computer program product for capacity reduction in a storage system is provided. The computer program product is embodied on a non-transitory computer readable medium, the computer program product including instructions that, when executed by a computer, causes the computer to perform operations. The operations include for each of a candidate page and a target page in the storage system, identifying a subset of sectors having identical data or a minimum threshold amount of different data, performing a bit-wise exclusive OR (XOR) operation on sectors of the candidate page and the target page, storing results of compressed bit-wise XOR operation in a XOR page, and determining entropy from results of the XOR operation. The entropy indicates corresponding data between the candidate page and target page are different. Upon determining the entropy is less than or equal to a threshold value, the method includes building a reference page from the XOR sector, and performing the compression operation on the reference page.

BRIEF DESCRIPTION OF THE DRAWINGS

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

Figure 1:
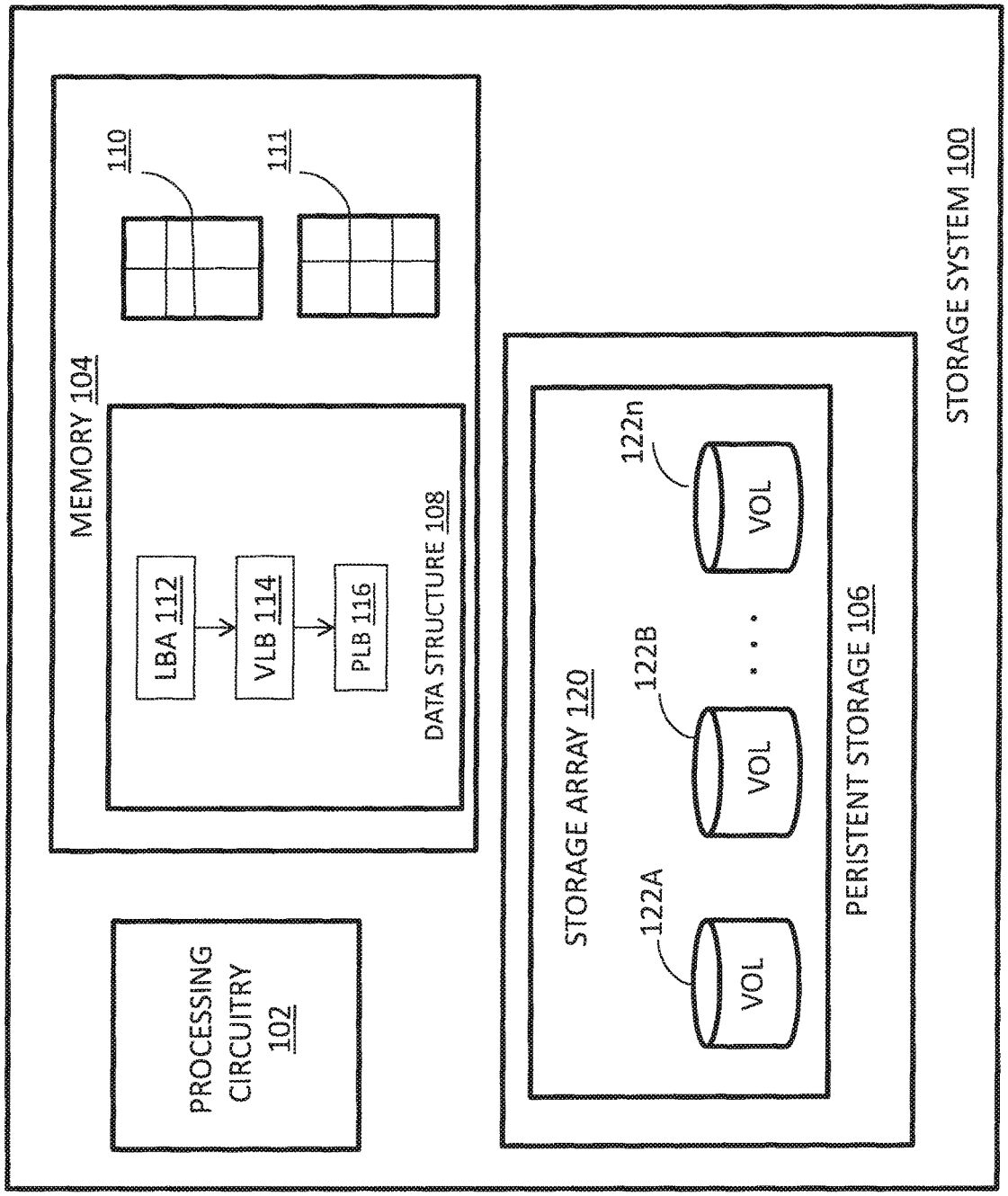
FIG. 1 is a diagram of an example of a storage system according to embodiments.

Before describing embodiments of the concepts, structures, and techniques sought to be protected herein, some terms are explained. The following description includes a number of terms for which the definitions are generally known in the art. However, the following glossary definitions are provided to clarify the subsequent description and may be helpful in understanding the specification and claims.

As used herein, the term "storage system" is intended to be broadly construed so as to encompass, for example, private or public cloud computing systems for storing data as well as systems for storing data comprising virtual infrastructure and those not comprising virtual infrastructure. As used herein, the terms "client," "host," and "user" refer, interchangeably, to any person, system, or other entity that uses a storage system to read/write data, as well as issue requests for configuration of storage units in the storage system. In some embodiments, the term "storage device" may also refer to a storage array including multiple storage devices. In certain embodiments, a storage medium may refer to one or more storage mediums such as a hard drive, a combination of hard drives, flash storage, combinations of flash storage, combinations of hard drives, flash, and other storage devices, and other types and combinations of computer readable storage mediums including those yet to be conceived. A storage medium may also refer both physical and logical storage mediums and may include multiple level of virtual to physical mappings and may be or include an image or disk image. A storage medium may be computer-readable, and may also be referred to herein as a computer-readable program medium. Also, a storage unit may refer to any unit of storage including those described above with respect to the storage devices, as well as including storage volumes, logical drives, containers, or any unit of storage exposed to a client or application. A storage volume may be a logical unit of storage that is independently identifiable and addressable by a storage system.

In certain embodiments, the term "IO request" or simply "IO" may be used to refer to an input or output request, such as a data read or data write request or a request to configure and/or update a storage unit feature. A feature may refer to any service configurable for the storage system.

In certain embodiments, a storage device may refer to any non-volatile memory (NVM) device, including hard disk drives (HDDs), solid state drivers (SSDs), flash devices (e.g., NAND flash devices), and similar devices that may be accessed locally and/or remotely (e.g., via a storage attached network (SAN)(also referred to herein as storage array network (SAN)).

In certain embodiments, a storage array (sometimes referred to as a disk array) may refer to a data storage system that is used for block-based, file-based or object storage, where storage arrays can include, for example, dedicated storage hardware that contains spinning hard disk drives (HDDs), solid-state disk drives, and/or all-flash drives. Flash, as is understood, is a solid-state (SS) random access media type that can read any address range with no latency penalty, in comparison to a hard disk drive (HDD) which has physical moving components which require relocation when reading from different address ranges and thus significantly increasing the latency for random IO data.

In certain embodiments, a data storage entity and/or storage unit may be any one or more of a file system, object storage, a virtualized device, a logical unit, a logical unit number, a logical volume, a logical device, a physical device, and/or a storage medium.

In certain embodiments, a logical unit (LU) may be a logical entity provided by a storage system for accessing data from the storage system, and as used herein a logical unit is used interchangeably with a logical volume. In many embodiments herein, a LU or LUN (logical unit number) may be used interchangeable for each other. In certain embodiments, a LUN may be a logical unit number for identifying a logical unit; may also refer to one or more virtual disks or virtual LUNs, which may correspond to one or more Virtual Machines. In certain embodiments, a volume refers to a unit of storage on a disk.

In certain embodiments, a storage cluster may refer to a type of configuration that enables stretched clusters (e.g., clusters distributed across different geographic locations). Storage cluster configurations enable entities to provide load balancing and migrations between data centers.

In certain embodiments, Log Structured Storage (LSS) refers to a file system in which data and metadata are written sequentially to a circular buffer, called a log. Log-structured file systems reclaim free space from the tail of the log to prevent the file system from becoming full when the head of the log wraps around to meet it. The tail can release space and move forward by skipping over data for which newer versions exist farther ahead in the log. If there are no newer versions, then the data is moved and appended to the head.

In certain embodiments, a block refers to a sequence of bytes or bits, having a maximum length (block size). The block size can be fixed or variable. A block device, or block storage device may refer to a level of abstraction for hardware that is responsible for storing and retrieving specified blocks of data. In certain embodiments, a file system may be based on a block device, which may be a level of abstraction for the hardware responsible for storing and retrieving specified blocks of data. Block storage may be abstracted by a file system or database management system (DBMS) for use by applications and end users. Physical or logical volumes accessed via block IO may be devices internal to a server, directly attached via SCSI or Fibre Channel, or remote devices accessed via storage area network (SAN) using protocols such as iSCSI.

While vendor-specific terminology may be used herein to facilitate understanding, it is understood that the concepts, techniques, and structures sought to be protected herein are not limited to use with any specific commercial products. In addition, to ensure clarity in the disclosure, well-understood methods, procedures, circuits, components, and products are not described in detail herein.

The phrases, "such as," "for example," "e.g.," "exemplary," and variants thereof, are used herein to describe non-limiting embodiments and are used herein to mean "serving as an example, instance, or illustration." Any embodiments herein described via these phrases and/or variants are not necessarily to be construed as preferred or advantageous over other embodiments and/or to exclude the incorporation of features from other embodiments. In addition, the word "optionally" is used herein to mean that a feature or process, etc., is provided in some embodiments and not provided in other embodiments." Any particular embodiment of the invention may include a plurality of "optional" features unless such features conflict.

Modern log structure storage systems (LSS) usually support deduplication methods to reduce physical storage capacity to enable more logical capacity for the same given physical space. Deduplication can be performed for full page (e.g., 4K) deduplication. However, in many cases, sub-sector deduplication is not performed due to several reasons. For example, a sub-sector (which is less than 512 MB) is a very small piece of data which means that looking for such matching fragments, may require more resources in terms of metadata representation and CPU cycles than the (if at all) any benefit of such reduction. Also, compression, which is very common in storage systems, reduces further the need for sub-sector dedupe as differences between a compressed sector and a compressed partial sector may be even smaller. As such, only a technique that could enable sub-sector reduction that would consume small to little representing metadata and CPU cycles would be desirable.

Deduplication is typically discovered using a hash function. A hash table is built that represents most pages stored. For each new page, a lookup for a match is performed via the hash table. The hash may be deterministic (e.g., 20 bytes SHA1 is widely considered a full-page match) or not, which means the hash is not sufficient and a full-page compare is required. The same can be applied for sectors.

A partial page match occurs when several identical sectors between two pages exist but there are one or more sectors that differ. A partial match results with a metadata representation that marks identical sectors and, in some cases, only those of the sectors that are unique (i.e., non-identical sectors) are stored.

A partial page match (e.g., several matching sectors between two pages) can be implemented using a page compare function in which two pages are checked sector-by-sector to determine which sectors contain identical data. In an embodiment, an exclusive OR (XOR) operation is performed on each pair of a plurality of non-identical pairs of sectors between two pages under comparison. The results of the XOR operation (which is simply one bit per sector), can be stored instead of the original data, thereby conserving capacity.

Non-identical sectors may be sourced by many factors among others including timestamps, sequence number, and other fields which represent a very small portion of the sector.

As indicated above, the embodiments described herein stores the XOR results of non-identical sectors instead of the unique data. In this way, considering that most of the sector is identical (i.e., consisting of many zeros), the XOR will result in a sector that compresses very efficiently.

Turning now to FIG. 1, a system 100 for implementing sector-based capacity reduction in a storage system environment will now be described in accordance with embodiments. The storage system 100 of FIG. 1 includes processing circuitry 102, memory 104, and persistent storage 106. In an embodiment, the persistent storage 106 may be locally installed within the storage system 100, as shown in FIG. 1, or may be an external or remote device that is communicatively coupled to the storage system 100 via a connection (not shown).

If the persistent storage 106 is remote, it may be coupled to the storage system via known connections, interfaces and network circuitry, e.g., Ethernet cables, Wireless Fidelity (Wi-Fi) wireless connections, an IP network, SCSI cables, SATA cables, Fibre Channel (FC) cables, etc. If the connection is a network connection, then interfaces and network circuitry may include, for example, one or more Ethernet cards, cellular modems, FC adapters, Wi-Fi wireless networking adapters, and/or other devices for connecting to a network. If the connection to the persistent storage is a local storage connection, then interface and/or network interface circuitry may include for example, SCSI, SAS, ATA, SATA, FC, and/or other similar controllers and ports.

The persistent storage 106 may include any kind of persistent storage devices, such as, for example, hard disk drives, solid-state storage devices, flash drives, etc. Persistent storage 106 stores user data as volumes 122A-122n, which represents one or more logical disks accessible by users. Volumes 122A-122n are organized and managed with reference to metadata that is stored within various data structures, such as metadata structure 108 in memory 104. As shown in FIG. 1, by way of non-limiting example, the persistent storage is implemented via a storage array 120. While the unit of data storage is described herein as volumes in a storage array, it is understood that other units of data storage or object storage may be employed to realize the advantages of the embodiments.

The memory 104 may be any kind of digital system memory, such as, for example, random access memory (RAM). Memory 104 stores an operating system (OS, not depicted) in operation (e.g., a Linux, UNIX, Windows, MacOS, or similar operating system). Memory 104 may also store an input/output (I/O) stack in operation (not shown). The I/O stack allows I/O requests (not depicted) from external hosts (as well as local applications) to be processed with respect to the volume data 122A-122n managed by the storage system 100.

The memory 104 also stores an index 110 for tracking metadata corresponding to blocks subject to compression. A hash table 111 is provided in the memory 104. The hash table 111 contains hashed values of pages stored in the system. For each new page, a lookup for a match is performed via the hash table. The hash may be deterministic (e.g., 20 bytes SHA1 is widely considered a full-page match) or not, which means the hash is not sufficient and a full-page compare is required. The same can be applied for sectors.

A partial page match occurs when several identical sectors between two pages exist but there are one or more sectors that differ. A partial match results with a metadata representation that marks identical sectors and stores only those of the sectors that are unique (i.e., non-identical sectors).

The storage system includes processing circuitry 102, which may be any kind of processor or set of processors configured to perform operations, such as, for example, a microprocessor, a multi-core microprocessor, a digital signal processor, a system on a chip, a collection of electronic circuits, a similar kind of controller, or any combination of the above. It will be understood that the storage system 100 may also include other components as are well-known in the art, including interconnection circuitry. In operation, the processing circuitry 102 may execute one or more application, which may be implemented in logic executable by the processing circuitry.

The processing circuitry 102 is configured to receive and service input/output (IO) requests from one or more external or remote systems (not shown) that are communicatively coupled to the storage system 100. The coupling may be implemented via any type of communication network, such as Internet, local area network, wide area network, and may include wireline and/or wireless technology.

The volumes 122A-122n may be addressable via a logical address that is mapped to a physical address of the array through a three level of indirection scheme that is used to perform address translation during read and write operations with respect to the array.

In deduplication processes, levels of indirection with respect to storage addressing may be used to translate or map between layers of storage space. (i) low-level mappings (leaves) that contain pointers to data, (ii) mid-level mappings that contain pointers to the low-level mappings, and (iii) top-level mappings contain pointers to the mid-level mappings. The low level can be logical block address space (LBA), the mid level can be virtual block address space (VLB), and the top level can be physical address space (PLB). Each of these address spaces reflect a range of addresses. The mapping can be implemented using a data structure that takes a logical address and uses a pointer to point to a VLB address, which in turn points to a physical address (PLB) in which certain data (e.g., such as a page) resides.

Figure 2:
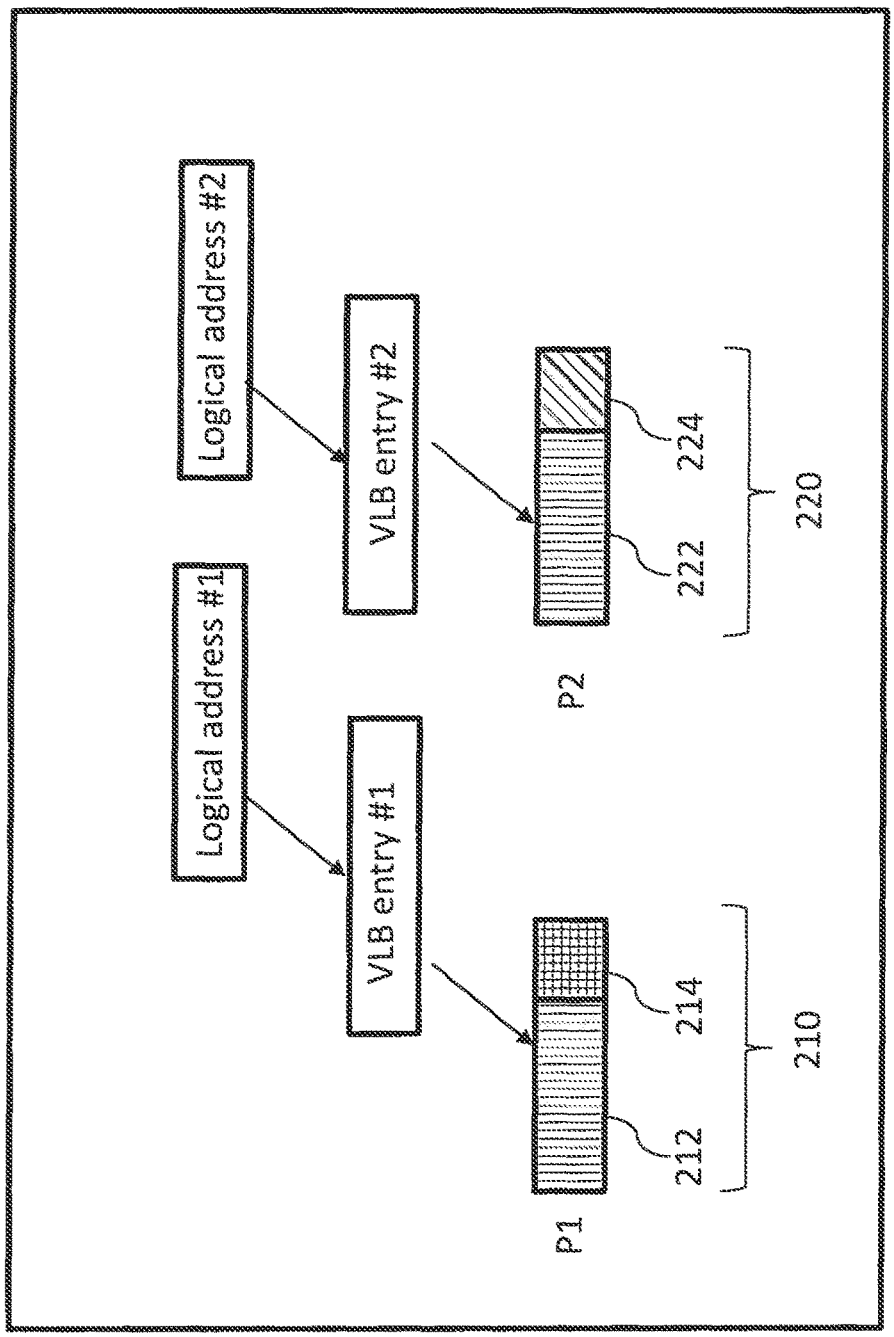
FIG. 2 is a diagram depicting an example metadata data structure.
Figure 3:
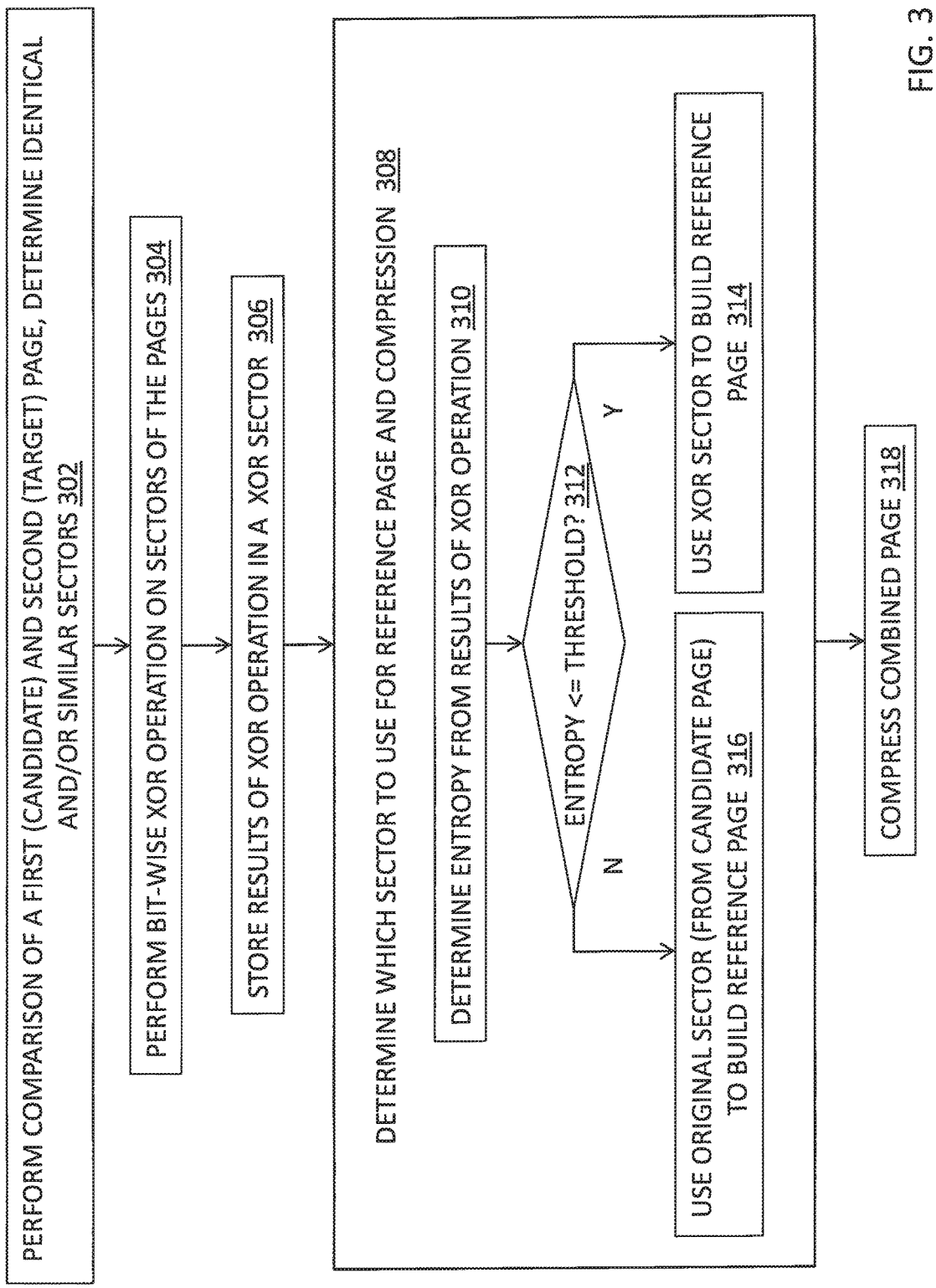
FIG. 3 is a flowchart of a process according to embodiments.

As shown in FIG. 2, a metadata data structure, which corresponds to the metadata structure 108 in FIG. 1, may be implemented in a Log Structured Storage (LSS) system, includes a three-level indirection scheme to access user data. The three level scheme includes a logical block address (LBA) level (i.e., leaf level), a virtual block (VLB) level, and a physical block (PLB) level. The leaf is a logical block address (LBA) representation layer that is generally organized as a tree where each leaf corresponds to a specific LBA range. In log-structured storage systems, the data is stored in contiguous chunks of data, which is referred to as PLB (e.g., 2 MB chunks). The actual user data pages reside inside the PLB and are referenced by the VLB.

Deduplication may be implemented using a unique hash representing a page. The system may include a deduplication index that represents most hashes (which in turn represent most unique capacity of the cluster of volumes. A partial page match occurs when a subpage (e.g., few sectors of the page) match as between two pages (e.g., part of the page are unique and part of the pages are in common).

A logical representation of metadata in a data structure 200 for two partial matching pages (P1 and P2, 210 and 220, respectively) in a cluster for which full page deduplication is performed is shown in FIG. 2. As shown in FIG. 2, the two pages P1 and P2 are maintained separately of one another (i.e., no common part of the pages are maintained by the system). The common part of the pages (i.e., represent duplicate data) are shown as 212 and 222. The page P1 also contains data 214 which is not in common with P2. Likewise, the page P2 contains data 224 that is not in common with page P1. Thus, the data stored in part of the page P1 (214) is not a duplicate of the part of the data stored in P2 (224). In the metadata structure 200 of FIG. 2, for page P1 (210), a logical address #1 for the page points to a VLB entry #1, which in turns points to the page P1. Virtual logical block (VLB) entries #1 and #2 correspond to VLB 114 in FIG. 1. Also in the metadata structure 200 of FIG. 2, for page P2 (220), a logical address #2 for the page points to a VLB entry #2, which in turn points to the page P2. Logical addresses #1 and #2 correspond to logical block address (LBA) 112 in FIG. 1. Pages P1 and P2 correspond to physical block address PLB 116 in FIG. 1.

In one non-limiting embodiment described herein, a technique for identifying non-identical sectors between two pages, and through an exclusive OR (XOR) operation performed on the non-identical sectors, storing one bit of information per byte per sector resulting from the XOR operation. The bit of information indicates whether a byte in the first page is identical or not to a corresponding byte in the second page. If the number of outputs returning True or '1' (or differ from '0') in the XOR operation exceeds a predefined threshold number (e.g., 90 percent of the total number of bytes in the sector), then compression is performed on the XOR page instead of the original page. Otherwise, the threshold value is not met, then compression is performed on the original page. It will be understood by those skilled in the art that alternatives to the embodiment described above may be used. For example, even if all the bits are '1,' there may still be good compressibility (e.g., a page and its bitwise not).

Non-identical sectors may be sourced by many factors among others including timestamps, sequence number, and other fields which represent a very small portion of the sector. This may include an area where the same data is found but it differs due to, e.g., a timestamp or checksum fields which change a few bytes thereby resulting in nearly identical or substantially identical sectors, but not identical.

As indicated above, the embodiments described herein stores the compressed XOR results of non-identical sectors instead of the unique data. In this way, considering that most of the sectors are identical (i.e., XOR result page consisting of many zeros), the XOR will result in a sector that compresses very efficiently.

Turning now to FIGS. 3 and 4A-4C, a process 300 and example pages 400A, 400B, and XOR sector 400C for implementing sub-sector-based capacity reduction will now be described in embodiments. The process 300 of FIG. 3 assumes that a request or a triggering event has caused the system to initiate comparison of two pages (referred to herein as a first (or candidate) page and a second (or target) page) in the storage system. The process described in FIG. 3 also assumes that a comparison of two pages results in considerable number of bytes matching between the pages. The pages 400A and 400B are each e.g., 4K in size and contain 8 sectors, each sector (e.g., representative sectors 404A and 404B) containing 512 Bytes.

Figure 4A:
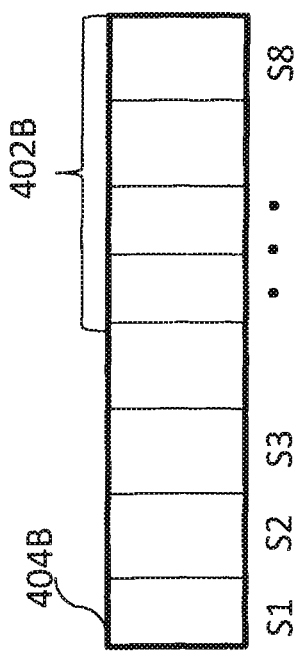
FIGS. 4A-4B are diagrams depicting pages in a storage system.
Figure 4B:
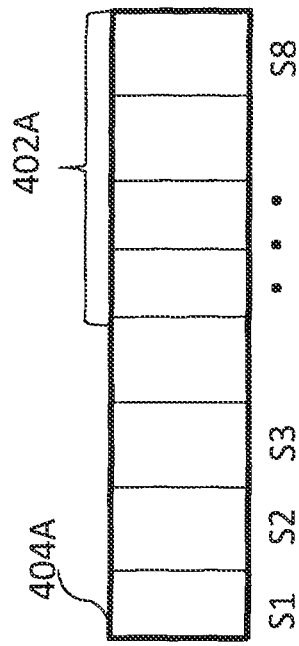

In block 302, the process 300 identifies, for a candidate page a target page identical and/or nearly identical sectors. FIGS. 4A and 4B illustrate two pages 400A and 400B in which a group of sectors 402A and 402B, respectively, are identical or substantially similar. By way of non-limiting example, this may be accomplished by accessing the hash table 111 (of FIG. 1) and performing a look up for sectors' hash values corresponding to the pages or using similarity hashes that correlate to similar (not only exact) sectors or pages. The lookup of the sectors results in the hashed values of the sectors, which can be compared to determine whether a match or similarity exists. If it exists for one or more of the sectors and actual pages compared, the pages can be considered a partial page match for the given sectors. It will be understood that the process may be extended to identify not just identical sectors, but also nearly identical sectors, e.g., those sectors that differ by only a few number or a percentage of bytes.

Figure 4C:
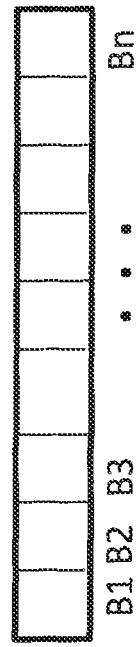
FIG. 4C is an example XOR result sector according to embodiments.

In block 304, the process 300 performs a bit-wise exclusive OR (XOR) operation on the non-identical (or all in case of similarity) sectors of the pages, and results of the XOR operation are stored in an XOR structure in block 306. An example XOR sector 400C having fields for bytes (B1-Bn) is shown in FIG. 4C. The XOR sector 400C refers to an intermediate structure that is used during the process when determining which sector (i.e., original page sector or XOR sector) to use in building a new reference page and for performing compression.

The process described in blocks 310-316 provides a non-limiting example of a heuristic method to select the XOR sector or the original sector. The process determines the entropy from results of the XOR operation which entropy may be used to determine which sector to use for a reference page. Entropy may refer to the predictability of data, such as a detectable pattern in data, or lack thereof. For example, if certain data appears in a page, how likely is it that the next piece of data will be present. If there is little or no predictability, this means there is little or no detectable pattern in the data, which means it would not lend itself well to compression (e.g., where many zero bytes are present in a page, a low entropy for this page is determined). Since the process deals with lossless compression (the performance of the compression algorithm is bound by the page's entropy), however, since we can find a similar page that we XOR the page to, we are able to reduce the page's entropy without losing the data thereby allowing lossless compression to be more effective (as the entropy of the new page is lower). It will be understood that other means of selecting the sector may be employed in order to realize the advantages of the embodiments described herein. For example, the process may determine a number of non-zero bytes per sector using a threshold value with respect to the number of non-zero bytes to determine whether to use an original sector from a candidate page or the XOR sector to build a reference page. The non-zero bytes reflect the bytes that differ as between the two pages. Thus, in block 308, the process 300 determines which sector to use for the reference page, as described in blocks 310-316.

In block 310, the process 300 determines the entropy from the results of the XOR operation. The entropy determined can be a quantifiable value that reflects a detectable pattern in the data.

In block 312, the process 300 determines if the entropy is less than or equal to a pre-defined threshold value. The threshold value can be a number of bytes or a percentage of the total bytes. If the entropy is equal to or less the threshold value, this means that a low number of bytes are different between the pages. In this event, the process 300 uses the XOR sector to build the reference page and (and later to do the compression in block 314). Otherwise, if the entropy exceeds the threshold value, the process 300 uses the original sector (the sector from the candidate page comparison) for building the reference page and later for compression in block 316. In block 318, a compression operation is performed on the reference page (combined page).

The sub-sector-based capacity reduction offers many benefits. For example, a single bit is enough to indicate unique (candidate) or XORed data; thus, very little metadata is needed. In addition, the process involves very little computation efforts as the XOR operation is simple to implement. Further, neighboring sectors often have the same high probability of similarity rendering the byte-wise comparisons beneficial.

Figure 5:
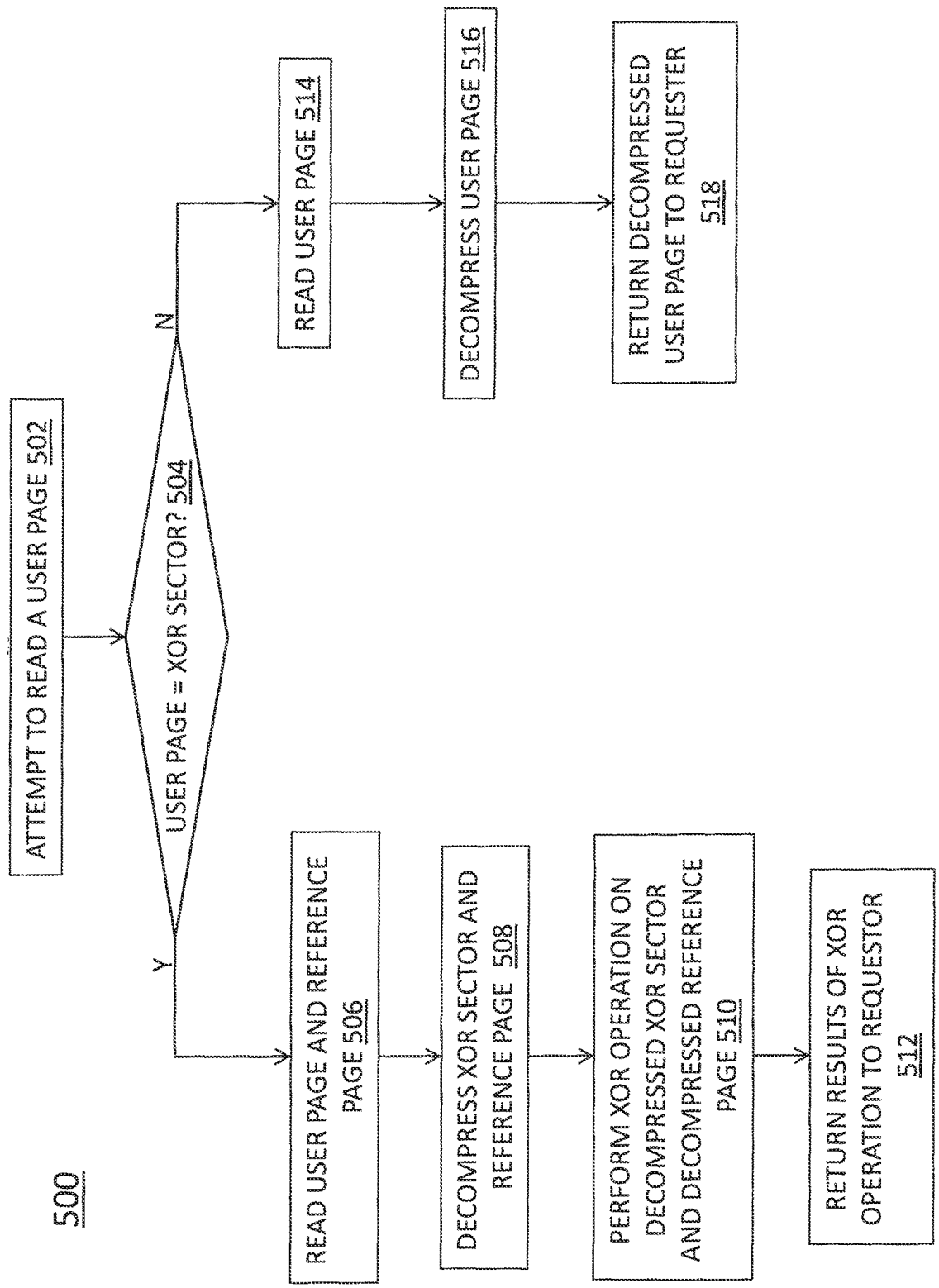
FIG. 5 is a flowchart of a process according to further embodiments.

Turning now to FIG. 5, a process 500 for decompressing a page (e.g., a compressed page from FIG. 4) will now be described in accordance with embodiments.

In block 502, the process 500 attempts to read a user page. In block 504, the process 500 determines whether the user page is an XOR sector. If so, the process 500 reads the user page and a corresponding reference page in block 506. In block 508, the process 500 decompresses the XOR sector and the reference page and, in block 510, the process 500 returns the results of the decompressing to a requester of the user page.

In block 512, upon determining the user page is not an XOR sector (from block 504), the process 500 reads the user page in block 514, decompresses the user page in block 516, and returns results of the decompressing to the requestor in block 518.

Figure 6:
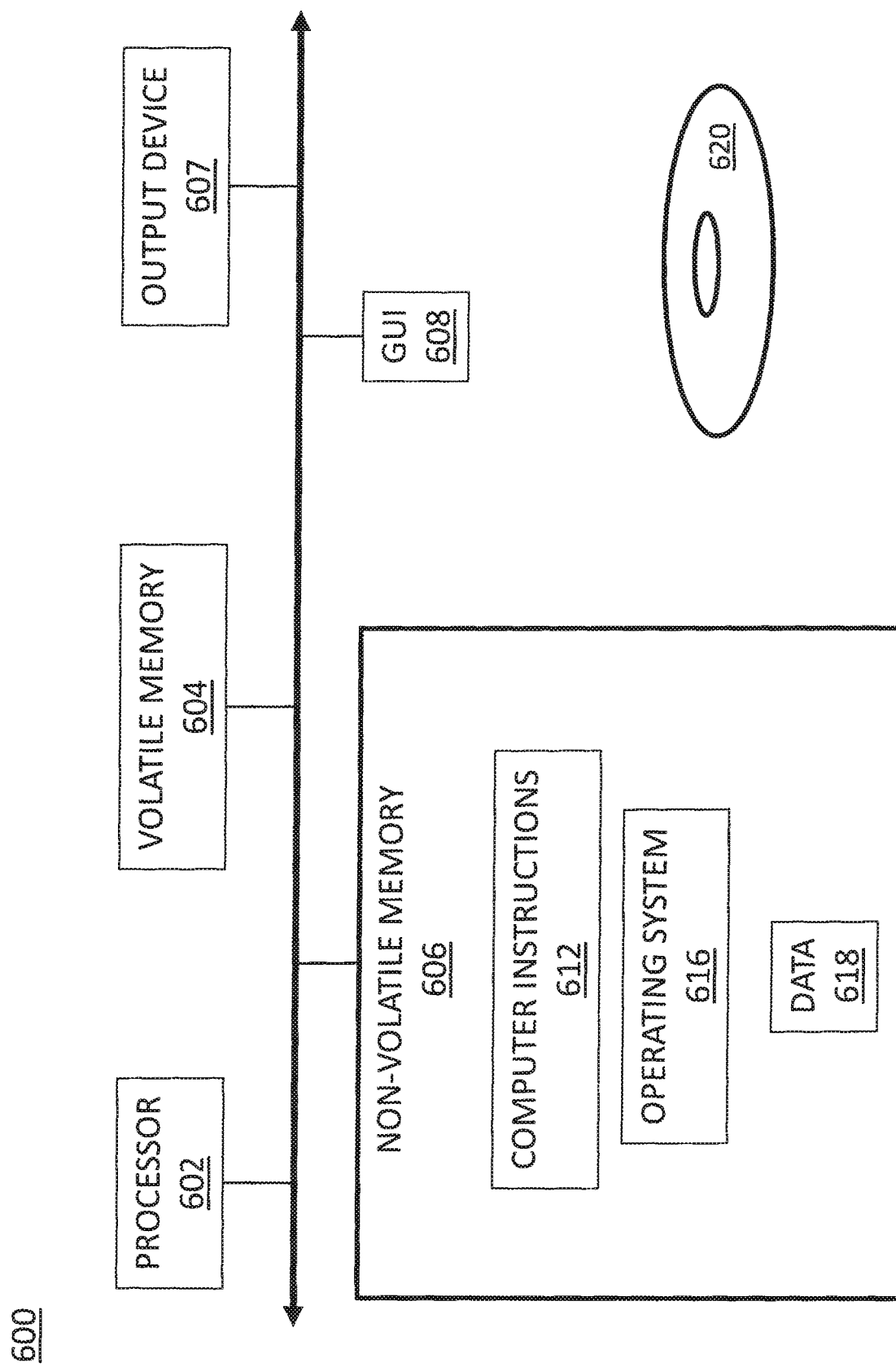
FIG. 6 is a diagram of an example of a computing device according to embodiments.

FIG. 6 shows an exemplary computer 600 (e.g., physical or virtual) that can perform at least part of the processing described herein. The computer 600 includes a processor 602, a volatile memory 604, a non-volatile memory 606 (e.g., hard disk or flash), an output device 607 and a graphical user interface (GUI) 608 (e.g., a mouse, a keyboard, a display, for example). The non-volatile memory 606 stores computer instructions 612, an operating system 616 and data 618. In one example, the computer instructions 612 are executed by the processor 602 out of volatile memory 604. In one embodiment, an article 620 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to the disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

The invention claimed is:

1. A method for implementing capacity reduction in a storage system, the method comprising:

for each of a candidate page and a target page in the storage system, identifying a subset of sectors having identical data or a minimum specified amount of non-identical data;

performing a bit-wise exclusive OR (XOR) operation on sectors of the candidate page and the target page;

determining entropy from results of the XOR operation; and upon determining the entropy is less than or equal to a threshold value, building a reference page from an XOR sector containing results of the bit-wise XOR operation, wherein compression is performed on the reference page.

2. The method of claim 1, further comprising:

upon determining the entropy is greater than a threshold value:

building the reference page from a corresponding sector of the candidate page; and performing the compression on the reference page;

wherein the entropy indicates corresponding data between the candidate page and target page are different.

3. The method of claim 2, wherein determining the entropy from results of the XOR operation includes determining a number of non-zero bytes per sector from the results of the XOR operation;
   wherein upon determining the number of non-zero bytes is less than or equal to the threshold value, building the reference page from the XOR sector containing results of the bit-wise XOR operation; and
   wherein upon determining the number of non-zero bytes is greater than the threshold value, building the reference page from the corresponding sector of the candidate page.

4. The method of claim 1, wherein the candidate page and the target page are determined to be a partial match with respect to the identical or minimum amount of non-identical data.

5. The method of claim 1, wherein identifying the subset of sectors having identical data or the minimum specified amount of non-identical data includes retrieving identifiers of the sectors from a hash table and comparing hashed values of the sectors, wherein the data in the sectors are considered a match when the hashed values are the same.

6. The method of claim 1, wherein performing the bit-wise XOR operation on the sectors includes performing the bit-wise XOR operation on the non-identical data.

7. The method of claim 1, wherein performing the bit-wise XOR operation on the sectors includes performing the bit-wise XOR operation on all sectors having the minimum specified amount of non-identical data.

8. The method of claim 1, further comprising:
   attempting to read a user page; and
   upon determining the user page is the XOR sector:
   reading the user page and corresponding reference page;
   decompressing the XOR sector and the reference page; and
   returning results of the decompressing to a requestor.

9. The method of claim 8, further comprising:
   upon determining the user page is not the XOR sector:
   reading the user page;
   decompressing the user page; and
   returning results of the decompressing the user page to the requestor.

10. A system for implementing capacity reduction in a storage system environment, the system comprising:
    a memory comprising computer-executable instructions; and
    a processor executing the computer-executable instructions, the computer-executable instructions when executed by the processor cause the processor to perform operations comprising:
    for each of a candidate page and a target page in the storage system, identifying a subset of sectors having identical data or a minimum specified amount of non-identical data;
    performing a bit-wise exclusive OR (XOR) operation on sectors of the candidate page and the target page that are not in the subset;
    determining entropy from results of the XOR operation; and
    upon determining the entropy is less than or equal to a threshold value, building a reference page from an XOR sector containing results of the bit-wise XOR operation, wherein compression is performed on the reference page.

11. The system of claim 10, wherein the operations further comprise:
    upon determining the entropy is greater than a threshold value:
    building the reference page from a corresponding sector of the candidate page; and
    performing the compression operation on the reference page;
    wherein the entropy indicates corresponding data between the candidate page and target page are different.

12. The system of claim 11, wherein determining the entropy from results of the XOR operation includes determining a number of non-zero bytes per sector from the results of the XOR operation;
    wherein upon determining the number of non-zero bytes is less than or equal to the threshold value, building the reference page from the XOR sector containing results of the bit-wise XOR operation; and
    wherein upon determining the number of non-zero bytes is greater than the threshold value, building the reference page from the corresponding sector of the candidate page.

13. The system of claim 10, wherein the candidate page and the target page are determined to be a partial match with respect to the identical or minimum amount of non-identical data.

14. The system of claim 10, wherein identifying the subset of sectors having identical data or the minimum specified amount of non-identical data includes retrieving identifiers of the sectors from a hash table and comparing hashed values of the sectors, wherein the data in the sectors are considered a match when the hashed values are the same.

15. The system of claim 10, wherein performing the bit-wise XOR operation on the sectors includes performing the bit-wise XOR operation on the non-identical data.

16. The system of claim 10, wherein performing the bit-wise XOR operation on the sectors includes performing the bit-wise XOR operation on all sectors having the minimum specified amount of non-identical data.

17. A computer program product for implementing capacity reduction in a storage system environment, the computer program product embodied on a non-transitory computer readable medium, and the computer program product including instructions that, when executed by a computer, causes the computer to perform operations. The operations include:
    for each of a candidate page and a target page in the storage system, identifying a subset of sectors having identical data or a minimum specified amount of non-identical data;
    performing a bit-wise exclusive OR (XOR) operation on sectors of the candidate page and the target page that are not in the subset;
    determining entropy from results of the XOR operation;
    upon determining the entropy is less than or equal to a threshold value, building a reference page from an XOR sector containing results of the bit-wise XOR operation, wherein compression is performed on the reference page.

18. The computer program product of claim 17, wherein the operations further comprise:
    upon determining the entropy is greater than a threshold value:
    building the reference page from a corresponding sector of the candidate page; and
    performing the compression on the reference page;
    wherein the entropy indicates corresponding data between the candidate page and target page are different.

19. The computer program product of claim 18, wherein determining the entropy from results of the XOR operation includes determining a number of non-zero bytes per sector from the results of the XOR operation;
   wherein upon determining the number of non-zero bytes is less than or equal to the threshold value, building the reference page from the XOR sector containing results of the bit-wise XOR operation; and
   wherein upon determining the number of non-zero bytes is greater than the threshold value, building the reference page from the corresponding sector of the candidate page.

20. The computer program product of claim 17 wherein the candidate page and the target page are determined to be a partial match with respect to the identical or minimum amount of non-identical data.

\* \* \* \* \*